United States Patent
Hyun et al.

(10) Patent No.: US 7,439,566 B2
(45) Date of Patent: Oct. 21, 2008

(54) SEMICONDUCTOR MEMORY DEVICE HAVING METAL-INSULATOR TRANSITION FILM RESISTOR

(75) Inventors: Jae-Woong Hyun, Uijeongbu-si (KR); In-Kyeong Yoo, Suwon-si (KR); Yoon-Dong Park, Yongin-si (KR); Choong-Rae Cho, Gimhae-si (KR); Sung-Il Cho, Boryeong-si (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 98 days.

(21) Appl. No.: 11/485,340

(22) Filed: Jul. 13, 2006

(65) Prior Publication Data
US 2007/0085122 A1   Apr. 19, 2007

(30) Foreign Application Priority Data
Oct. 13, 2005   (KR) .................. 10-2005-0096515

(51) Int. Cl.
*H01L 29/06* (2006.01)
(52) U.S. Cl. .................. 257/296; 257/350; 257/379; 257/382; 257/E27.084; 257/E49.002
(58) Field of Classification Search ........... 257/296, 257/E27.084
See application file for complete search history.

(56) References Cited

U.S. PATENT DOCUMENTS

| 5,365,095 | A  | * | 11/1994 | Shono et al. ............... 257/295 |
| 6,426,536 | B1 | * | 7/2002  | Misewich et al. .......... 257/410 |
| 6,624,463 | B2 |   | 9/2003  | Kim |

* cited by examiner

*Primary Examiner*—Tu-Tu V Ho
(74) *Attorney, Agent, or Firm*—Harness, Dickey & Pierce, P.L.C.

(57) ABSTRACT

A semiconductor memory device may have a lower leakage current and/or higher reliability, e.g., a longer retention time and/or a shorter refresh time. The device may include a switching device and a capacitor. A source of the switching device may be connected to a first end of a metal-insulator transition film resistor, and at least one electrode of the capacitor may be connected to a second end of the metal-insulator transition film resistor. The metal-insulator transition film resistor may transition between an insulator and a conductor according to a voltage supplied to the first and second ends thereof.

17 Claims, 5 Drawing Sheets

SEMICONDUCTOR MEMORY DEVICE HAVING METAL-INSULATOR TRANSITION FILM RESISTOR

PRIORITY STATEMENT

This application claims the benefit of Korean Patent Application No. 10-2005-0096515, filed on Oct. 13, 2005 in the Korean Intellectual Property Office, the disclosure of which is incorporated herein in its entirety by reference.

BACKGROUND OF THE INVENTION

1. Field of the Invention

Example embodiments of the present invention relate to a semiconductor device, and more particularly, to a semiconductor memory device storing data, for example, a DRAM device.

2. Description of the Related Art

Currently, data processing quantity and data processing speed of semiconductor memory devices have been increased, and in turn, semiconductor memory devices have attained higher capacitance and higher integration. However, further highly integrated semiconductor memory devices, e.g., DRAM devices, involve increased leakage current. An increase of the leakage current may decrease the reliability of a DRAM device, e.g., a refresh characteristic and a retention characteristic.

For example, increase of a refresh time and decrease of a retention time may dissipate an electric power of the DRAM device. Also, an Error Correction Code (ECC) circuit for a refresh control may occupy a large area to impede the increase of the integration of the DRAM device.

Figure 1:
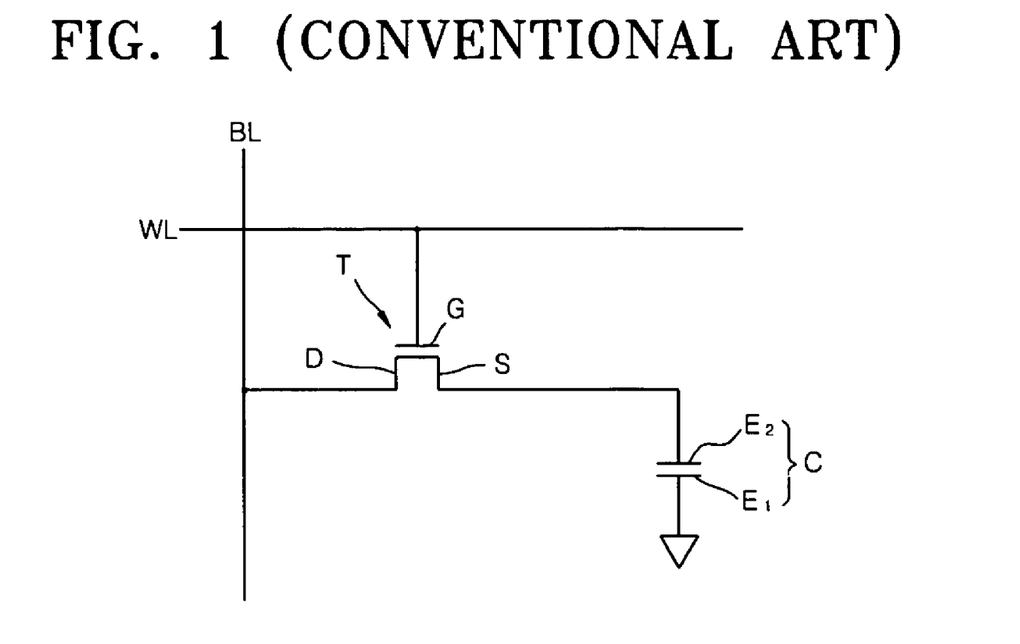
FIG. 1 is a circuit diagram of a conventional DRAM device.

FIG. 1 is a circuit diagram of a conventional DRAM device.

Referring to FIG. 1, a DRAM device may include a transistor T and a capacitor C. The transistor T includes a gate G, a source S and a drain D. The capacitor C includes two electrodes E1 and E2. The drain D of the transistor T may be connected to a bit line BL, and the source S may be connected to one electrode E2 of the capacitor C. The gate G of the transistor T may be connected to a word line WL. The bit line BL may supply power and the word line WL may control the transistor T. Charge stored in the capacitor C may be gradually eliminated due to leakage current. For example, the leakage current may include a leakage current (first) occurring between the electrodes E1 and E2 of the capacitor C, an off-current (second) between the source S and the drain D of the transistor T, a junction leakage current (third) of the source S and the drain D of the transistor T, and a leakage current (fourth) of the gate G of the transistor T.

The first leakage current is related to the capacitor C, and the second through fourth leakage currents are related to the transistor T. Higher integration attained in the DRAM device is associated with a dimensional decrease of the transistor T. The decreased dimension of the transistor T may increase the foregoing second through fourth leakage currents. For example, the dimensional decrease of the transistor T may cause a length decrease of the gate G, a decrease of a junction depth of the source S and the drain D, a thickness decrease of a gate insulating layer (not shown) for insulating the gate G.

For example, a decrease of the gate length may cause a short channel effect to abruptly increase the off current of the transistor T. The decrease of the junction depth of the source S and the drain D may increase the junction leakage current.

The decrease of the gate insulating layer may increase a Fowler-Nordheim (F-N) tunneling, increasing the leakage current of the gate G.

Therefore, in order to enhance the reliability of the highly integrated DRAM device, the leakage current must be decreased in the transistor portion.

SUMMARY OF THE INVENTION

Example embodiments of the present invention provide a semiconductor memory device having a lower leakage current and/or higher reliability, e.g., longer retention time and/or shorter refresh time.

According to an example embodiment of the present invention, there is provided a semiconductor memory device having a switching device including a gate, a source, and a drain. A word line may be electrically connected to the gate of the switching device and a bit line may be electrically connected to the drain of the switching device. A metal-insulator transition film resistor may have a first end connected to the source of the switching device, and transitions between an insulator and a conductor, in accordance with a voltage supplied to the first and a second end thereof. Also, a capacitor may include a pair of electrodes to store charge, and either one of the pair of electrodes may be connected to the second end of the metal-insulator transition film resistor.

According to an example embodiment, the switching element may be a Field Effect Transistor (FET) or a Metal-Oxide-Silicon FET (MOSFET). In an example embodiment, the metal-insulator transition film may comprise VOx, NiOx, CeOx or LTO (LaTiOx).

According to another example embodiment of the present invention, there is provided a semiconductor memory device having a semiconductor substrate including a source region and a drain region. A gate electrode may be formed on a portion of the semiconductor substrate between the source region and the drain region by interposing a gate insulating layer. A storage node electrode may be formed on the source region of the semiconductor substrate. Also, a metal-insulator transition film may be interposed between the source region and the storage node electrode of the semiconductor substrate, and may transition between an insulator and a conductor in accordance with a supplied voltage.

In an example embodiment, the metal-insulator transition film contacts the source region of the semiconductor substrate, and the semiconductor memory device further includes a storage node plug that connects the metal-insulator transition film to the storage node electrode.

In an example embodiment, the metal-insulator transition film may contact the storage node electrode, and further include a storage node plug that connects the metal-insulator transition film to the source region of the semiconductor substrate.

In an example embodiment, the metal-insulator transition film may contact the storage node electrode and the source region of the semiconductor substrate.

According to another example embodiment of the present invention, there is provided a method of manufacturing a semiconductor memory device including forming a source region and a drain region on a semiconductor substrate, forming a gate electrode on a portion of the semiconductor substrate between the source region and the drain region, forming a storage node electrode on the source region of the semiconductor substrate, and forming a metal-insulator transition film interposed between the source region and the storage node electrode.

According to another example embodiment of the present invention, there is provided a method of operating a semiconductor memory device including applying a first voltage to a metal-insulator transition film of the semiconductor memory device, such that the metal-insulator transition film acts as a conductor when the semiconductor memory device is in an operating state and applying a second voltage to the metal-insulator transition film of the semiconductor memory device, such that the metal-insulator transition film acts as an insulator when the semiconductor memory device is in a stand-by state.

BRIEF DESCRIPTION OF THE DRAWINGS

The above and other features and advantages of the present invention will become more apparent by describing in detail example embodiments thereof with reference to the attached drawings in which.

DETAILED DESCRIPTION OF EXAMPLE EMBODIMENTS OF THE INVENTION

The present invention will now be described more fully with reference to the accompanying drawings, in which example embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Also, the use of the words "compound," "compounds," or "compound(s)," refer to either a single compound or to a plurality of compounds. These words are used to denote one or more compounds but may also just indicate a single compound.

Now, in order to more specifically describe example embodiments of the present invention, various embodiments of the present invention will be described in detail with reference to the attached drawings. However, the present invention is not limited to the example embodiments, but may be embodied in various forms. In the figures, if a layer is formed on another layer or a substrate, it means that the layer is directly formed on another layer or a substrate, or that a third layer is interposed therebetween. In the following description, the same reference numerals denote the same elements.

Although the example embodiments of the present invention have been disclosed for illustrative purposes, those skilled in the art will appreciate that various modifications, additions and substitutions are possible, without departing from the scope and spirit of the invention as disclosed in the accompanying claims.

Hereinafter, the present invention will be described more fully with reference to the accompanying drawings, in which example embodiments of the invention are shown. In the drawings, the sizes and thicknesses of layers and regions are exaggerated for clarity.

Figure 2:
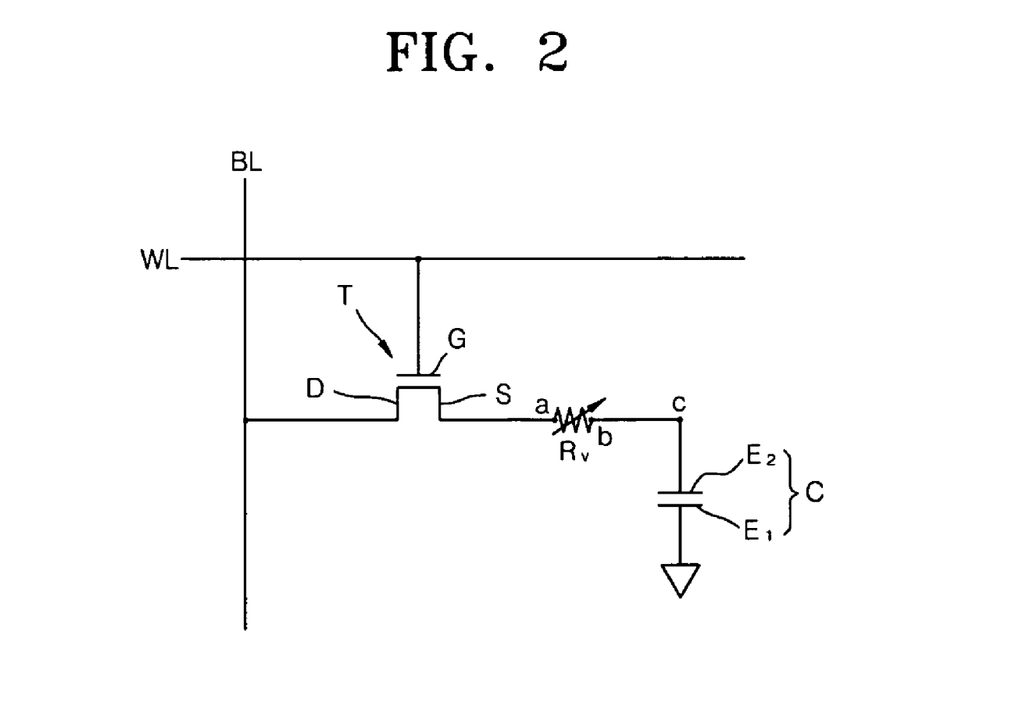
FIG. 2 is a circuit diagram illustrating a semiconductor memory device according to an example embodiment of the present invention.

FIG. 2 is a circuit diagram illustrating a semiconductor memory device according to an example embodiment of the present invention.

Referring to FIG. 2, the semiconductor memory device may include a transistor T, a capacitor C, and a metal-insulator transition (MIT) film resistor Rv. For example, the semiconductor memory device may be a DRAM device that stores charges in the capacitor C.

For example, the capacitor C may store charge in a pair of first and second electrodes E1 and E2 insulated by a dielectric film (not shown). The second electrode E2 of the capacitor C may act as a storage node electrode and the first electrode E2 may act as a plate electrode. In accordance with an operation of the semiconductor memory device, the first electrode E1 may be supplied with a desired or predetermined voltage or a ground voltage.

The transistor T is an illustrative example of a switching device, which may be a Field Effect Transistor (FET) or a Metal Oxide Silicon (MOS) FET. For example, the transistor T may include a gate G, a source S and a drain D. The transistor T may adjust a voltage applied to the gate G to control the turn-on or turn-off between the source S and the drain D. The source S and the drain D need not be distinguished by their designation, but rather may be classified by their function. Therefore, the source S and the drain D may be interchangeably designated in example embodiments of the present invention.

The drain D of the transistor T may be connected to a bit line BL and the gate G may be connected to a word line WL. The bit line BL may function to supply power and the word line WL may function to control the transistor T. The MIT film resistor Rv may be between the transistor T and the capacitor C. For example, the source S of the transistor T may be connected to one end a of the MIT film resistor Rv and the other end b of the MIT film resistor Rv may be connected to the second electrode E2 of the capacitor C.

Figure 4:
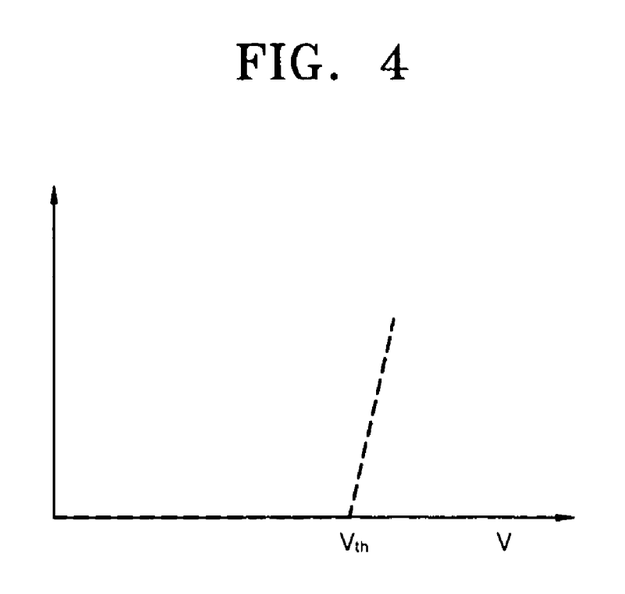
FIG. 4 is an example graph showing voltage-current characteristics of a metal-insulator transition film resistor.

The MIT film resistor Rv may transition between a conductor and an insulator by controlling the voltage supplied to both ends a and b thereof. As illustrated in FIG. 4, when a voltage V less than a threshold voltage Vth (V<Vth) is applied to both ends a and b of the MIT film resistor Rv, current barely flows through the MIT film resistor Rv. That is, the MIT film resistor Rv may act as an insulator. However, when a voltage V greater than the threshold voltage Vth (V>Vth) is applied to both ends a and b of the MIT film resistor Rv, the current through the MIT film resistor Rv may abruptly increase. That is, the MIT film resistor Rv also acts as a conductor.

The MIT film resistor Rv may comprise VOx, NiOx, CeOx or LTO (LaTiOx). Further description on the MIT resistor Rv may refer to a MOT insulator in Korea Patent Laid-open Publication No. 2003-024156 filed by Hyun Tak Kim, et al. When the semiconductor memory device, e.g., the DRAM device, is in an operating state, for example, writing, erasing or reading, the transistor T is turned-on to allow the MIT film resistor Rv to be supplied with power from the bit line BL. The power from the bit line BL may be generally greater than the threshold voltage Vth. Accordingly, when the DRAM device is in the operating state, the MIT film resistor Rv may act as a conductor.

However, if the DRAM device is in a stand-by state, the transistor T is turned-off. Therefore, the MIT film resistor Rv should be floated ideally, but, in view of a leakage current of the transistor T, an extremely low voltage, e.g., a voltage V lower than the threshold voltage Vth, is applied to both ends a and b of the MIT film resistor Rv. Accordingly, when the DRAM device is in a stand-by state, the MIT film resistor Rv may act as an insulator.

Therefore, in an example condition, both ends a and b of the MIT film resistor Rv are open in the stand-by state. In this example, the capacitor C is separated from the transistor T to make all leakage current components through the transistor T be eliminated. Only the leakage current through the electrodes E1 and E2 of the capacitor C will remain. Thus, if the MIT film resistor Rv acts as a perfect insulator, the leakage current of the semiconductor memory device, e.g., the DRAM device, may be decreased over a conventional semiconductor memory device.

However, the MIT film resistor Rv itself may involve a leakage current in the stand-by state. Accordingly, the MIT film resistor Rv may not be able to act as a perfect insulator, and a slight leakage current component through the transistor T may exist. But, as compared with the conventional semiconductor memory device of FIG. 1, the resistance of the MIT film resistor Rv is sufficiently great to render the leakage current components through the transistor T trivial.

Therefore, the leakage current components through the transistor T may be decreased. As such, the DRAM device may have a decreased refresh time and an increased retention time. That is, reliability of the DRAM device may be improved. Also, because the refresh time is decreased, a number of ECC circuits for controlling the refresh may be reduced. When considering that the ECC circuit occupies 50% or more of a cell region, the decreased number of ECC circuits may result in an increase of the integration of the semiconductor memory device.

The semiconductor memory device according to the present invention is not restricted to the circuit arrangement of FIG. 2. For example, the circuit arrangement of FIG. 2 is one unit cell arrangement, and the unit cells may be arranged as a matrix to constitute an array circuit arrangement of a semiconductor memory device.

Figure 3:
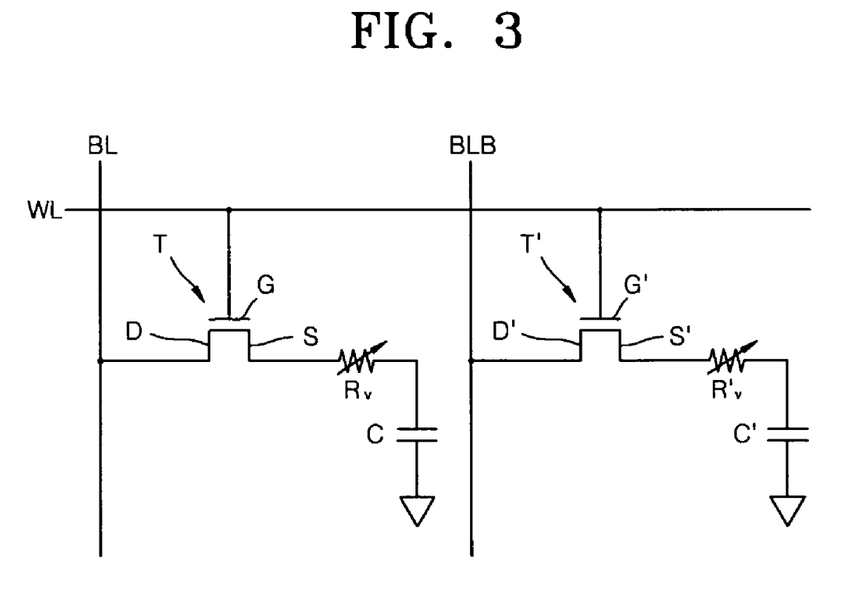
FIG. 3 is a circuit diagram illustrating a semiconductor memory device according to another example embodiment of the present invention.

FIG. 3 illustrates a semiconductor memory device according to another example embodiment of the present invention, e.g., two unit cells are arranged. The first unit cell on the left side may refer to FIG. 2.

Referring to FIG. 3, the second unit cell may include a transistor T', an MIT film resistor Rv' and a capacitor C'. The transistor T' may have a drain D', a source S', and a gate G'. The word line WL may be connected to the gate G'. A bit line bar BLB may be connected to the drain D' of the transistor T'.

A sense amplifier (not shown) may be connected between the bit line BL and the bit line bar BLB. The sense amplifier may read a voltage difference between the bit line BL and the bit line bar BLB. The sense amplifier may have a structure known to those skilled in the art.

Figure 5:
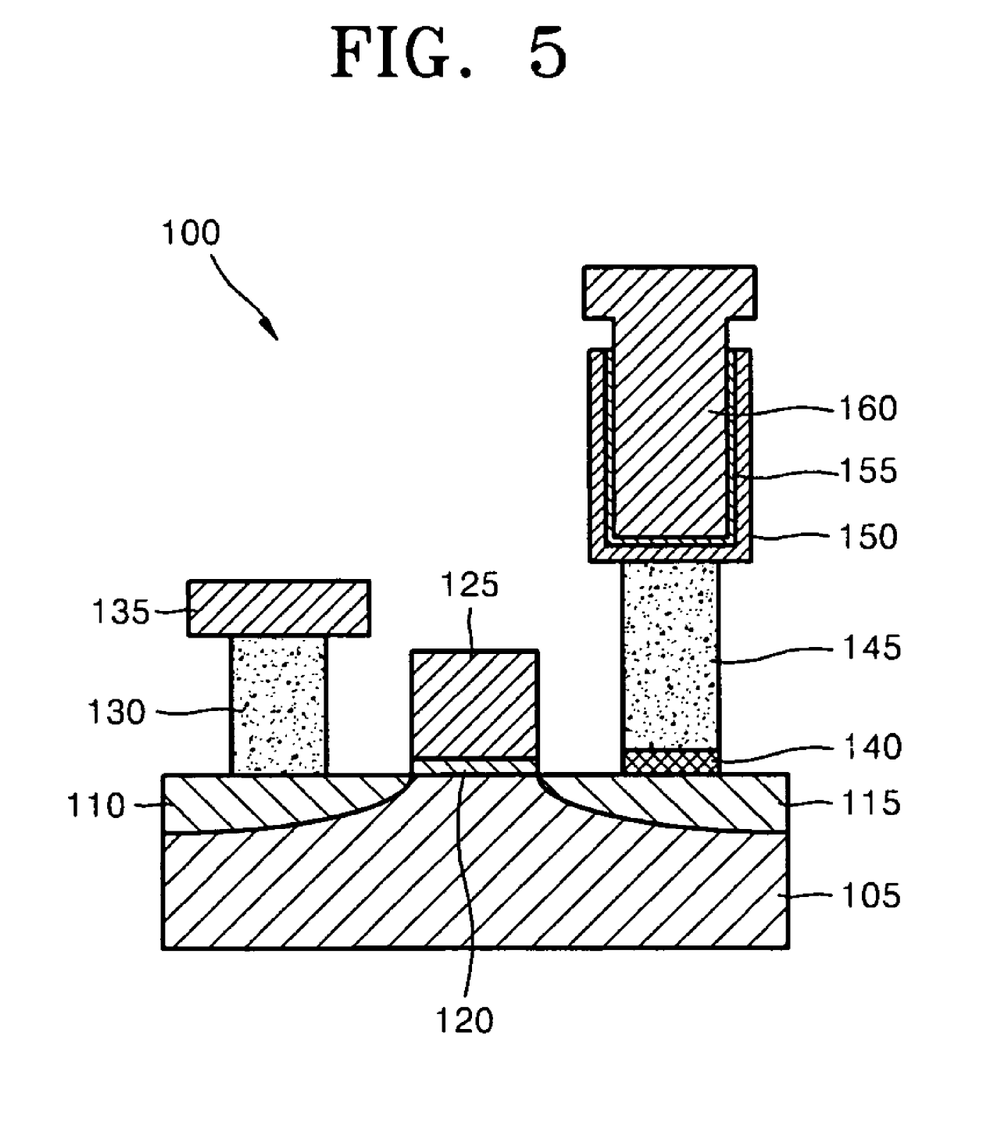
FIG. 5 is a cross-sectional view illustrating a semiconductor memory device according to an example embodiment of the present invention.

FIG. 5 is a cross-sectional view illustrating a semiconductor memory device 100 according to an example embodiment of the present invention. For example, the semiconductor memory device 100 may include a DRAM device.

Referring to FIG. 5, a semiconductor substrate 105 may have a drain region 110 and a source region 115. The drain region 110 and the source region 115 may be formed by doping an impurity in the semiconductor substrate 105. A gate electrode 125 may be formed on the semiconductor substrate 105 between the source region 115 and the drain region 110 by interposing a gate insulating layer 120. The source region 115, the drain region 110 and the gate electrode 125 may form a MOSFET structure. The MOSFET structure is known to those skilled in the art, and thus detailed description thereof will be omitted.

A storage node electrode 150 may be disposed on the source region 115 by interposing an MIT film 140. For example, the MIT film 140 may be formed on the source region 115 and a storage node plug 145 may be interposed between the MIT film 140 and the storage node electrode 150. As another example, the storage node electrode 150 may contact the MIT film 140 without interposing the storage node plug 145.

The MIT film 140 may refer to the foregoing description of FIG. 4. For example, the MIT film 140 may comprise VOx, NiOx, CeOx or LTO (LaTiOx).

A dielectric film 155 may be formed on the storage node electrode 150, and a plate electrode 160 may be formed on the dielectric film 155. The storage node electrode 150, the dielectric film 155 and the plate electrode 160 may form a capacitor structure. The structure of the storage node electrode 150, the dielectric film 155, and the plate electrode 160 is just illustrative. For example, the dielectric film 155 and the plate electrode 160 may also be formed along an outer sidewall of the storage node electrode 150.

A bit line electrode 135 may be disposed on the drain region 110. The drain region 110 and the bit line electrode 135 may be connected using a bit line plug 130.

An operation of the semiconductor memory device 100 may refer to the description of FIG. 2. In this example, the MOSFET structure corresponds to the transistor (T of FIG. 2), and the capacitor structure corresponds to the capacitor (C of FIG. 2).

As described above, when the semiconductor memory device, e.g., the DRAM device, is in the operating state, the MIT film 140 acts as a conductor. Also, when the DRAM device is in stand-by, the MIT film 140 acts as an ideal insulator or has a sufficiently high resistance. Accordingly, in the stand-by state, the leakage current of the charge stored in the storage node electrode 150 via the MIT film 140 is sufficiently decreased.

Figure 6:
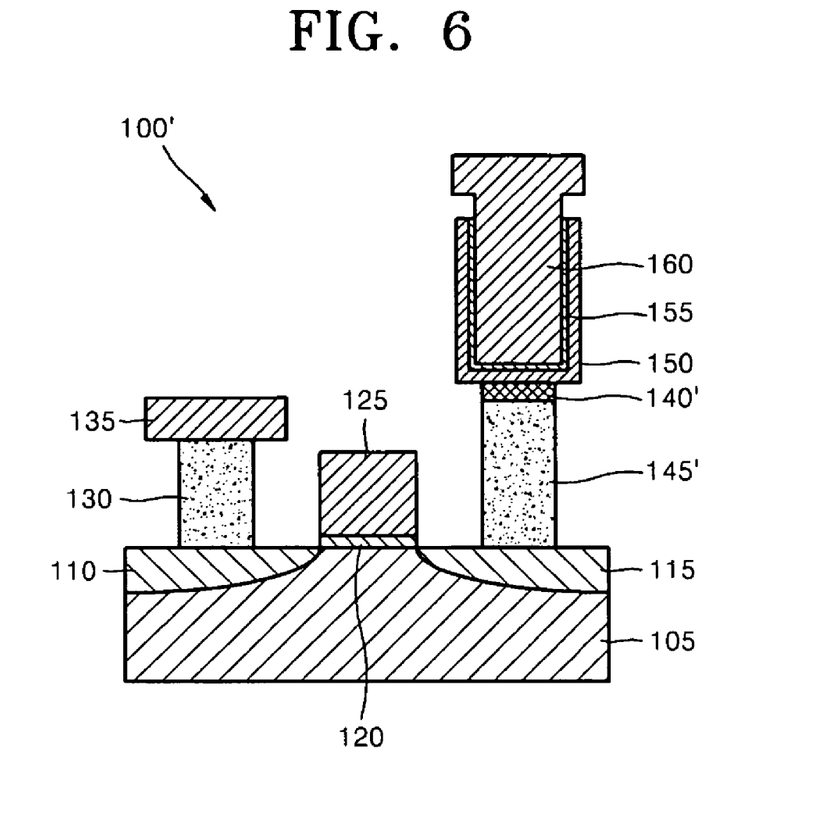
FIG. 6 is a cross-sectional view illustrating a semiconductor memory device according to another example embodiment of the present invention.

FIG. 6 is a sectional view illustrating a semiconductor memory device 100' according to another embodiment of the present invention. The semiconductor memory device 100' may refer to the description of the above embodiment, of which repeated description will be omitted. In both embodiments, like reference numerals in the drawings denote like elements.

Referring to FIG. 6, an MIT film 140' may contact under a storage node electrode 150, and a storage node plug 145' may be interposed between the MIT film 140' and a source region 115. That is, the MIT film 140' connects or opens the storage node electrode 150 and the storage node plug 145'.

Because the storage node plug 145' is connected to the source region 115, the semiconductor memory device 100' may be operated similarly to the semiconductor memory device (100 of FIG. 3) according to the above-stated example embodiment.

Hereinafter, a sensing margin of the semiconductor memory device according to an example embodiment of the present invention will be described in detail.

Figure 7:
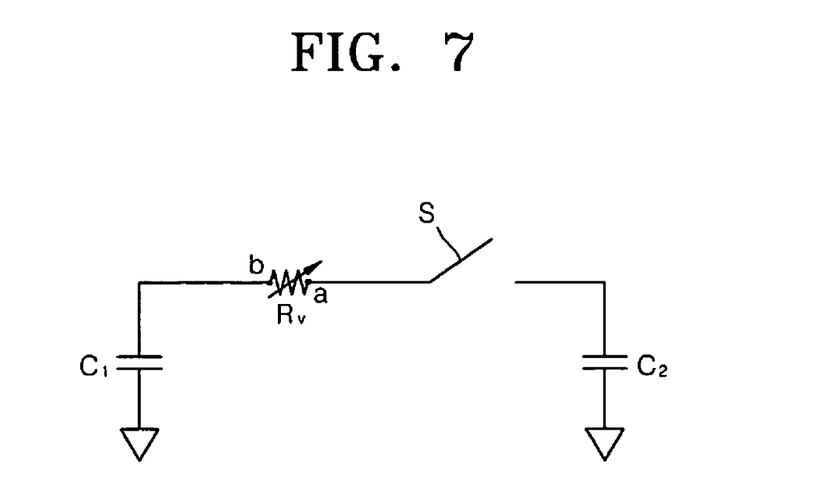
FIG. 7 is an equivalent circuit diagram of the semiconductor memory device according to an example embodiment of the present invention.

FIG. 7 is an equivalent circuit diagram to calculate the sensing margin of the semiconductor memory device.

Referring to FIG. 7, a switch S may be an equivalent to the transistor (T of FIG. 2), a first capacitor C1 may refer to the capacitor (C of FIG. 2), and the second capacitor C2 may be an equivalent capacitor of the bit line BL portion of FIG. 2.

In data "1" state, the sensing margin Vs can be defined as the following equation 1:

$$Vs = \frac{1}{2}VDD/(k+1) - Vth/(k+1),$$ [Equation 1]

where a potential of a second node b is VDD−Vth, a capacitance of the first capacitor C1 is Cs, a capacitance of the second capacitor C2 is CBL, and k=CBL/Cs.

For example, if the minimum sensing margin Vs is roughly 150 mV in case that k is roughly 2 and VDD is roughly 1.5V, the threshold voltage Vth has to be smaller than 0.3V. As another example, if the minimum sensing margin Vs is roughly 150 mV in case that k is roughly 2.5, the threshold voltage Vth has to be smaller than roughly 0.225V.

Therefore, the threshold voltage Vth of the MIT film resistor Rv or the MIT film (140 of FIG. 5) may be greater than zero and smaller than or equal to 0.3V, and further may be roughly 0.2V or so.

Figure 8:
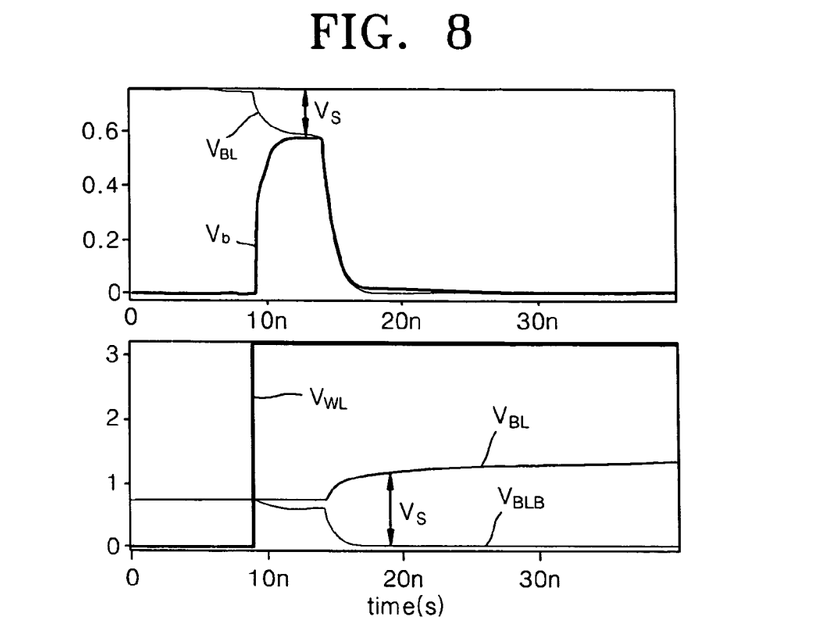
FIGS. 8 and 9 are example graphs illustrating a sensing margin by simulation of the semiconductor memory device shown in FIG. 3.
Figure 9:
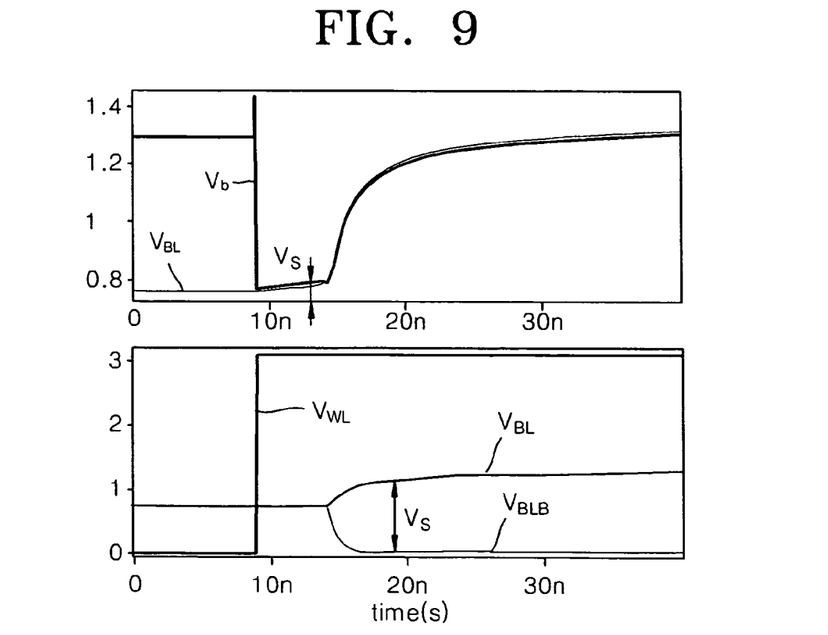

FIGS. 8 and 9 are graphs illustrating the sensing margin by simulation of the semiconductor memory device shown in FIG. 3. FIG. 8 illustrates the sensing margin when the semiconductor memory device is in a data "0" state, and FIG. 9 illustrates the sensing margin in case of a data "1" state. In order to improve accuracy of the simulation, a parasitic resistor (not shown), for example, a contact resistor may be added to the semiconductor memory device shown in FIG. 3.

Referring to FIGS. 8 and 9, the sensing margin Vs is achieved in both data "0" and data "1" states. As described above, the sensing margin Vs may be further increased by decreasing the threshold voltage Vth of the MIT film resistor (Rv of FIG. 7).

As a result, a semiconductor memory device according to example embodiments of the present invention may achieve an appropriate sensing margin and/or lower the leakage current.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A semiconductor memory device comprising:
a switching device including a gate, a source, and a drain;
a word line electrically connected to the gate of the switching device;
a bit line electrically connected to the drain of the switching device;
a metal-insulator transition film resistor having a first end connected to the source of the switching element, and transitioning between an insulator and a conductor in accordance with a voltage supplied to the first and a second end thereof;
a capacitor including a pair of electrodes to store charge, at least one of the pair of electrodes connected to the second end of the metal-insulator transition film resistor; and
wherein the metal-insulator transition film resistor is interposed between the source of the switching element and the at least one of the pair of electrodes of the capacitor.

2. The semiconductor memory device of claim 1, wherein the switching device is a Field Effect Transistor (FET) or a Metal-Oxide-Silicon FET (MOSFET).

3. The semiconductor memory device of claim 1, wherein the metal-insulator transition film resistor transitions to the conductor when a voltage greater than a threshold voltage is applied to the first and second ends thereof, and the threshold voltage is greater than zero and is smaller than or equal to 0.3V.

4. The semiconductor memory device of claim 1, the metal-insulator transition film resistor comprises $VO_x$, $NiO_x$, $CeO_x$ or LTO ($LaTiO_x$).

5. The semiconductor memory device of claim 1, wherein the semiconductor memory device is a DRAM device.

6. A matrix comprising a plurality of semiconductor memory devices of claim 1.

7. A semiconductor memory device comprising:
a semiconductor substrate including a source region and a drain region;
a gate electrode formed on a portion of the semiconductor substrate between the source region and the drain region by interposing a gate insulating layer;
a storage node electrode on the source region of the semiconductor substrate; and
a metal-insulator transition film interposed between the source region and the storage node electrode of the semiconductor substrate, and transitioning between an insulator and a conductor in accordance with a supplied voltage.

8. The semiconductor memory device of claim 7, further comprising a storage node plug that connects the metal-insulator transition film to the storage node electrode, wherein the metal-insulator transition film contacts the source region of the semiconductor substrate.

9. The semiconductor memory device of claim 7, further comprising a storage node plug that connects the metal-insulator transition film to the source region of the semiconductor substrate, wherein the metal-insulator transition film contacts the storage node electrode.

10. The semiconductor memory device of claim 7, wherein the metal-insulator transition film contacts the storage node electrode and the source region of the semiconductor substrate.

11. The semiconductor memory device of claim 7, further comprising a dielectric Mfim on the storage node electrode, and a plate electrode on the dielectric film.

12. The semiconductor memory device of claim 7, further comprising a bit line electrode connected to the drain region of the semiconductor substrate.

13. The semiconductor memory device of claim 7, wherein the metal-insulator transition film transitions to the conductor when a voltage greater than a threshold voltage is applied to the first and second ends thereof, and the threshold voltage is greater than zero and is smaller than or equal to 0.3V.

14. The semiconductor memory device of claim 7, wherein the metal-insulator transition film comprises $VO_x$, $NiO_x$, $CeO_x$ or LTO ($LaTiO_x$).

15. A method of manufacturing a semiconductor memory device comprising:
forming a source region and a drain region on a semiconductor substrate;
forming a gate electrode on a portion of the semiconductor substrate between the source region and the drain region;
forming a storage node electrode on the source region of the semiconductor substrate; and
forming a metal-insulator transition film interposed between the source region and the storage node electrode.

16. The method of claim 15, wherein the metal-insulator transition film contacts the source region of the semiconductor substrate.

17. The method of claim 15, wherein the metal-insulator transition film contacts the storage node electrode.

* * * * *